US 6,720,132 B2

(12) United States Patent
Tsai et al.

(10) Patent No.: US 6,720,132 B2
(45) Date of Patent: Apr. 13, 2004

(54) BI-LAYER PHOTORESIST DRY DEVELOPMENT AND REACTIVE ION ETCH METHOD

(75) Inventors: Ming Huan Tsai, Jubei (TW); Hun-Jan Tao, Hsinchu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 100 days.

(21) Appl. No.: 10/043,015

(22) Filed: Jan. 8, 2002

(65) Prior Publication Data

US 2003/0129539 A1 Jul. 10, 2003

(51) Int. Cl.[7] .............................. G03F 7/36; B44C 1/22; H01L 21/302
(52) U.S. Cl. ................. 430/312; 430/311; 430/313; 430/317; 216/67; 438/710; 438/725
(58) Field of Search .................. 430/311, 312, 430/313, 317; 216/67; 438/710, 725

(56) References Cited

U.S. PATENT DOCUMENTS

| 4,226,896 | A | * | 10/1980 | Coburn et al. ............... 427/490 |
| 4,938,839 | A | * | 7/1990 | Fujimura et al. ............ 438/514 |
| 5,447,598 | A | * | 9/1995 | Mihara et al. ................ 216/46 |
| 6,388,226 | B1 | * | 5/2002 | Smith et al. ............ 219/121.57 |
| 6,426,249 | B1 | * | 7/2002 | Geffken et al. ............. 438/239 |
| 6,444,408 | B1 | * | 9/2002 | Brock et al. ................. 430/322 |
| 6,570,256 | B2 | * | 5/2003 | Conti et al. ................. 257/761 |
| 2003/0119330 | A1 | * | 6/2003 | Tsai et al. ................... 438/717 |
| 2003/0134231 | A1 | * | 7/2003 | Tsai et al. ................... 430/312 |

OTHER PUBLICATIONS

Derwent Abstract of TW 506074, published Oct. 2002, "Opening formation carrying out the dry development and the subsequent etching step in–situ", Tau et al.*

* cited by examiner

Primary Examiner—Mark F. Huff
Assistant Examiner—Nicole Barreca
(74) Attorney, Agent, or Firm—Tung & Associates

(57) ABSTRACT

A method for semiconductor device feature development using a bi-layer photoresist including providing a non-silicon containing photoresist layer over a substrate; providing a silicon containing photoresist layer over the non-silicon containing photoresist layer; exposing an exposure surface of the silicon containing photoresist layer to an activating light source said exposure surface defined by an overlying pattern according to a photolithographic process; developing the silicon containing photoresist layer according to a photolithographic process to reveal a portion the non-silicon containing photoresist layer; and, dry developing said non-silicon containing photoresist layer in a plasma reactor by igniting a plasma from an ambient mixture including at least hydrogen and carbon monoxide.

23 Claims, 2 Drawing Sheets

BI-LAYER PHOTORESIST DRY DEVELOPMENT AND REACTIVE ION ETCH METHOD

FIELD OF THE INVENTION

This invention generally relates to photoresist methods for forming semiconductor features and more particularly to a bi-layer photoresist dry development method for high resolution features included in a continuous process including reactive ion etching.

BACKGROUND OF THE INVENTION

In semiconductor fabrication, various layers of insulating material, semiconducting material and conducting material are formed to produce a multilayer semiconductor device. The layers are patterned to create features that taken together, form elements such as transistors, capacitors, and resistors. These elements are then interconnected to achieve a desired electrical function, thereby producing an integrated circuit (IC) device. The formation and patterning of the various device layers are achieved using conventional fabrication techniques, such as oxidation, implantation, deposition, epitaxial growth of silicon, lithography, etching, and planarization.

As devices continue to shrink in size, the limits of processing technologies are reached requiring new and cost effective innovations. For example, acceptable photoresist imaging is one limiting technology that has required the adoption of new approaches as finer imaging resolutions are sought to meet the requirements of smaller device sizes. For example, single layer photoresist layers have the problem that they need both effective etching resistance and depth of focus (DOF) requirement. However, the former requirement calls for thicker photoresist layers while the latter requirement calls for thinner photoresist layers. One approach has been to move to bi-layer and tri-layer photoresist layers where the uppermost photoresist layer is used for imaging thereby allowing a thinner image layer and acceptable depth of focus (DOF) with a larger photo-window. Consequently, resolution, and pattern width control are enhanced.

A corresponding requirement to achieve high resolution features and critical dimension control is an effective development process. Wet processing techniques have increasingly become inadequate due to several problems including photoresist poisoning of features by leaving undeveloped photoresist caused by either or both, step height limitations affecting the photo imaging process or by residual nitrogen contaminating species interfering with photoresist exposure and development processes.

As such, dry development processes involving plasma etching have been increasingly adopted leading to improved etching profiles. However, dry etching (plasma etching) has demonstrated problems of its own including, for example, critical dimension bias between isolated and dense line areas where, due to microloading, isolated lines etch faster than dense lines leading to unacceptable differences in critical dimension. For example, in single layer photoresists, dry development of, for example, via holes, leads to roughened hole edges or "striation". If a hard mask, such as a metal nitride, is used over the inter-layer dielectric (ILD) insulating layer, the via hole edges are tapered to wider dimension referred to as "top CD blow out". Bi-layer approaches have led to some improvement in dry etching critical dimension control, however, further improvement is need in etching selectivity in dry development as resolution demands are increased, for example with 193 nm and 157 nm photoresists.

For example, more recent shorter wavelength photoresist approaches have used a surface modification technique where the surface of a photoresist film is silylated after the exposure to light. Following exposure, a dry development process is used to form a pattern having good resolution and resistance to dry etching. According to this technique, an initial pattern is formed in a region of about 1000 Angstroms of thickness within of the photoresist film. The silylated surface layer is intended to protect the lower layer from premature etching thus resulting in better selectivity and smoother etching profiles following dry etching of a feature. However, at the dry development stage, the plasma etching procedure according to the prior art has the shortcoming that the sidewalls of the underlying photoresist layer may be over-etched, causing a tapered cross section and loss of critical dimension. Sidewall etching of the underlying photoresist layer in the bi-layer approach with surface layer silylation is believed to occur since the silylation is limited to about the first 200 to 300 Angstroms adjacent the surface of the upper photoresist layer. As a result, the stability of the pattern deteriorates as the dry etching development process proceeds through the photoresist layers.

In the prior art, the dry development etching process has used a sulfur dioxide ($SO_2$) based chemistry including oxygen ($O_2$). Sulfur dioxide ($SO_2$) based chemistry in dry development forms a passivating layer on the sidewalls of the photoresist layers thereby, in theory, increasing the anisotropicity of the etching process to reduce the microloading effects. However, as mentioned, the sulfur dioxide dry development chemistry has limitations, including continued problems with loss of critical dimension during dry development.

For example, one problem associated with the sulfur dioxide ($SO_2$) based chemistry dry development of the prior art include corrosive effects believed to be related to the formation of sulfuric acid, e.g. ($H_2SO_4$) leading to corrosion of, for example, copper-filled vias and trenches causing degradation of the copper layers to include peeling of the copper layers. In addition, other features of multi-layer semiconductor devices included in a semiconductor process wafer are generally adversely affected by corrosive action. Yet another adverse effect associated with sulfur dioxide ($SO_2$) based chemistry in dry development processes is the formation of water (H2O) during the dry development process leading to moisture adsorption by low-k (dielectric constant) layers and subsequently to via poisoning.

Another problem with prior art dry development processes is the requirement that photoresist dry development, photoresist layer removal (ashing), and feature etching typically require separate plasma reactors due the large number of residual particles generated during the ashing or feature etching process. Consequently there is a high probability of contamination in the photoresist dry development of the prior art if for example, an ashing process in a separate chamber follows dry development prior to feature etching whereby movement of the semiconductor wafer from one plasma chamber to another increases the likelihood of particle contamination. As a result, the dry development procedure according to the prior art is equipment and time intensive, with residual particle contamination issues, leading to higher manufacturing expense.

There is therefore a need in the semiconductor processing art to develop a more reliable bi-layer photoresist dry development process with high resolution that may be carried out without the corrosion problems and particle contamination problems associated with the prior art dry development methods.

It is therefore an object of the invention to provide to develop a more reliable bi-layer photoresist dry development process with high resolution that may be carried out without the corrosion problems and particle contamination problems associated with the prior art dry development methods while overcoming other shortcomings and deficiencies in the prior art.

SUMMARY OF THE INVENTION

To achieve the foregoing and other objects, and in accordance with the purposes of the present invention, as embodied and broadly described herein, the present invention provides a method for semiconductor device feature development using a bi-layer photoresist.

In a first embodiment according to the present invention, a method is provided including the steps of providing a non-silicon containing photoresist layer over a substrate; providing a silicon containing photoresist layer over the non-silicon containing photoresist layer; exposing an exposure surface of the silicon containing photoresist layer to an activating light source said exposure surface defined by an overlying pattern according to a photolithographic process; developing the silicon containing photoresist layer according to a photolithographic process to reveal a portion the non-silicon containing photoresist layer; and, dry developing said non-silicon containing photoresist layer in a plasma reactor by igniting a plasma from an ambient mixture including at least hydrogen and carbon monoxide.

In another embodiment, the plasma reactor includes at least one RF power source for plasma excitation and at least one RF power source for accelerating plasma generated ions towards the substrate surface.

In a related embodiment, the non-silicon containing photoresist layer comprises a non-photoactive polymer.

In another related embodiment, the ambient mixture includes about 1 part hydrogen and about 10 to about 100 parts carbon monoxide, a remaining balance of said ambient mixture further including Argon to total 100 parts. Further yet, the activating light source has a wavelength of one of about 157 nanometers and about 193 nanometers.

In another related embodiment, the non-silicon containing photoresist layer has a thickness greater than the silicon containing photoresist layer. Further, the non-silicon containing photoresist layer has a thickness of about 1000 Angstroms to about 5000 Angstroms and the silicon containing photoresist layer has a thickness of about 500 Angstroms to about 3000 Angstroms.

In another embodiment, the method further includes the step of removing the silicon containing photoresist layer according to a first in-situ ashing process following the step including dry developing. Further, the first in-situ ashing process includes igniting an oxygen containing plasma said oxygen containing plasma further including at least one of nitrogen and fluorine ions said oxygen containing plasma being optimized to simultaneously clean plasma contact surfaces.

In another embodiment, the method further includes the step of etching a semiconductor feature through at least a portion of the substrate according to a reactive ion etch process. Further, the semiconductor feature includes at least one of a via hole, a trench line, a contact hole, a shallow trench isolation feature, and a polysilicon gate feature.

In another embodiment, the method further includes the step of removing the non-silicon containing photoresist layer according to a second in-situ ashing process. Further, the second in-situ ashing process further includes igniting an oxygen containing plasma further including at least one of nitrogen and fluorine, the oxygen containing plasma being optimized to simultaneously clean plasma contact surfaces. Further yet, the second in-situ cleaning process includes maintaining the oxygen containing plasma at an ambient pressure of about 5 to about 20 mTorr, supplying power to the first RF power source at about 200 to about 300 Watts, and supplying power to the second RF power source at about 100 to about 150 Watts.

In another embodiment, the method further includes the step of reactively ion etching through a thickness of a metal nitride layer included in the substrate using a hydrofluorocarbon containing plasma to at least partially form the semiconductor feature.

In another embodiment, the method further includes the step of performing an in-situ cleaning process including igniting an oxygen containing plasma further including at least one of nitrogen and fluorine said oxygen containing plasma being optimized to clean plasma contact surfaces. Further yet, the insitu cleaning process includes operating the oxygen containing plasma at an ambient pressure of about 5 to about 20 mTorr, supplying power to the first RF power source at about 200 to about 300 Watts, and supplying power to the second RF power source at about 100 to about 150 Watts.

In another embodiment, the step including the first in-situ ashing process is combined with the step including the second in-situ ashing process following the step of etching the semiconductor feature to remove the silicon containing photoresist layer and the non-silicon containing photoresist layer.

In another embodiment, the step of the step of etching a semiconductor feature further includes etching through an insulating layer with a dielectric constant of less than about 3 included in the substrate.

In another embodiment, the steps including dry developing, the first in-situ ashing process, the reactive ion etch process, the second in-situ-ashing process, and the in-situ cleaning process are carried out in the plasma reactor according to a continuous process.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the present invention is explained by reference to a via forming process it will be appreciated that the present invention may be applied to the photolithographic patterning and etching of any semiconductor feature where critical dimension control and high resolution may be advantageous. For example, the present invention may be applied to the patterning and etching of dual damascene structures including both via and trench lines, polysilicon gate structures, and shallow trench isolation structures (STI) to mention a few exemplary applications.

One approach, for example, in forming the dual damascene structure is to form an insulating layer that is coated with a photoresist. The photoresist is exposed through a first mask with image pattern of the via openings, this via pattern is anisotropically etched in the upper half of the insulating layer. The photoresist is then exposed through a second mask with an image pattern of the conductive line. The pattern of the trench lines (conductive interconnect lines) is aligned with the pattern of the vias thereby encompassing the via openings. In anisotropically etching the openings for the trench lines in the lower half of the insulating layer, the via openings already present in the upper half of the insulating layer are simultaneously etched and replicated in the lower half of the insulating layer.

Figure 1A:
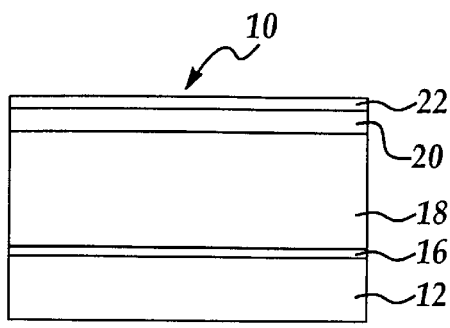
FIGS. 1A to 1G are cross sectional side view representations of a portion a semiconductor device according to an exemplary step wise manufacturing process according to the present invention.

For example, referring to FIG. 1A, is shown a portion of a dual damascene structure 10 at a stage in the manufacturing process. The structure 10 includes substrate 12, for example in the first layer of a multi-layer device, the substrate may be a silicon substrate. Other substrates may include, for example, in subsequent layers of a multi-layer device, an insulating layer with, for example, a conductive area formed therein. Overlying the substrate 12, is formed an etching stop layer 16, typically a metal nitride such as silicon nitride (e.g., $Si_3N_4$) or silicon oxynitride (e.g., SiON). The etching stop layer 16 is typically deposited by a (chemical vapor deposition (CVD) process including for example, PECVD (plasma enhanced CVD), LPCVD (low pressure CVD), or HDPCVD (high density plasma CVD) by reacting silane ($SiH_4$) or an amine-containing metal-organic precursor with ammonia ($NH_3$) or nitrogen, and including oxygen in the case the metal nitride is oxygen containing such as silicon oxynitride, under conditions that are well known in the art. The preferred thickness of the etching stop layer 16 is between about 300 and 1000 Angstroms.

Overlying the first etching stop layer 16 is an insulating, inter-layer dielectric (ILD) layer 18 for subsequently forming a semiconductor feature, for example, a via and trench line, formed of, for example, low-k carbon doped silicon dioxide. The ILD layer 18 may be formed by a PECVD process although other processes well known in the art may be used. The ILD layer 18 (ILD layer) is deposited to a preferred thickness of between about 4000 and 10000 Angstroms. As device sizes shrink, typically a low-k (low dielectric constant material) with a dielectric constant of less than about 3 is used for the ILD layer 18 in order to reduce signal delay times due to parasitic capacitance effects. It will be appreciated, however, that conventional silicon dioxide may also be used as the ILD layer 18. Other exemplary materials that may be used to form the ILD layer include low-k organic materials applied by a spin coating process that are known in the art.

In the method according to the present invention, a first photoresist layer 20 (bottom image layer) of a non-silicon containing organic material, for example a resinous I-line photoresist or acrylic polymer is deposited over the ILD layer 18 by a typical spin coating method. The photoresist layer 20 need not be photoactive, for example, need not contain a photogenerated acid. One exemplary organic resin for photoresist layer 20 may further include a polyvinyl alcohol resin. Photoresist layer 20 is preferably deposited to a thickness of between about 1000 Angstroms and 5000 Angstroms. The photoresist layer 20 is preferably baked at a temperature of between about 120° C. and 130° C. for a duration of between about 2 and 3 minutes.

A second photoresist layer 22 (top image layer) with a thickness of about 500 Angstroms to about 3000 Angstroms, preferably thinner than bottom image layer 20, is then formed over bottom image layer 20 by a similar method. The top image layer 22 is preferably a DUV photoresist formed of silicon containing organic including silicon monomers being photoactive at, for example, 193 nm and 157 nm. Exemplary photoresists include, for example, a terpolymer photoresist of methacrylic acid. Top image photoresist layer 22 is preferably applied by spin coating and baked at a temperature of between about 120° C. and 130° C. for a duration of between about 2 and 3 minutes.

Less preferably, a non-silicon containing photoresist may be used for top image layer 22 and subjected to a silylation process to form a silicon containing photoresist. During silylation, the photoresist is heated in an atmosphere containing a silylation agent. For example, typical silylation agents include N,N Diethylamino-trimethylsilane (TMSDEA), 1, 1, 3, 3-Tetramethyldisilazane (TMDS), Trimethylsilyldimethylamine (TMSDMA), Dimethylsilyl-diethylamine (DMSDEA), and Dimethylsilyldimethylamine (DMSDMA).

Both the silylation process and the silicon-containing photoresist will make the exposed portion of the top image photoresist layer 22 resistant to dry etchants during the dry development process by plasma reactive ion etching (RIE) forming, for example, $SiO_2$ along the sidewalls of the patterned silicon containing photoresist. However, a silicon containing photoresist is preferred for the top image photoresist layer 22 since the silylation process may be undesirably limited to the surface portion of the top image photoresist layer 22.

Figure 1B:
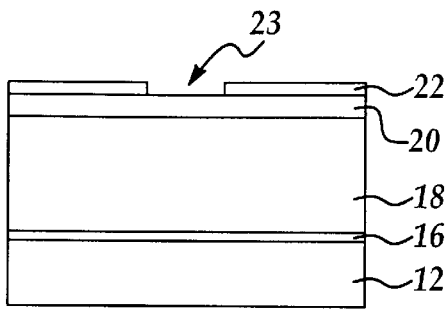
Figure 3:
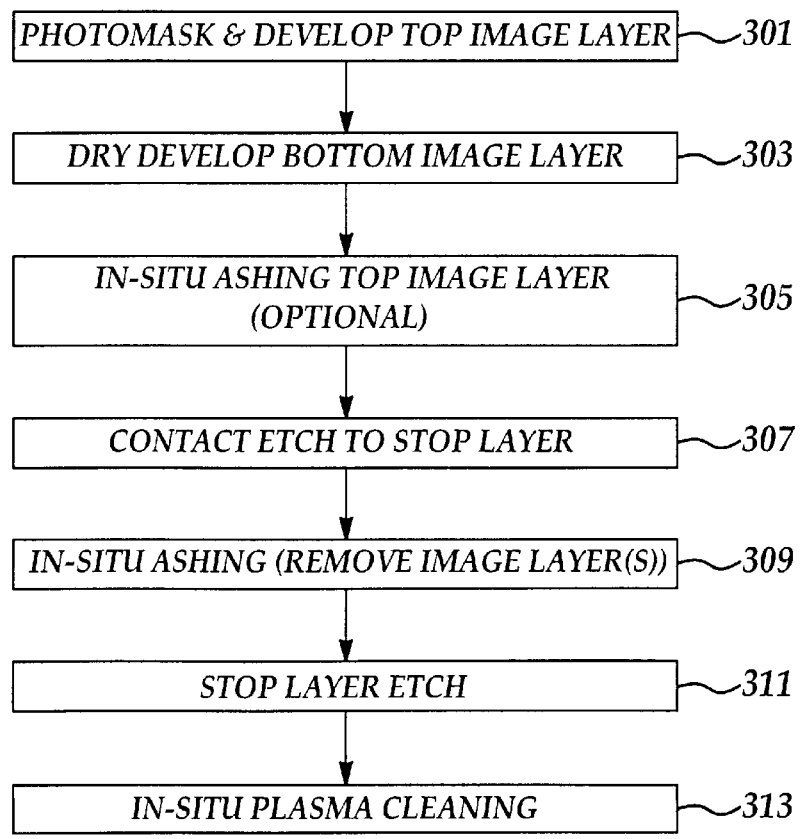
FIG. 3 is a process step flow diagram illustrating the sequence of steps included in various embodiments of the present invention.

Following deposition of photoresist layers 20 and 22, referring to FIG. 3 showing a process flow diagram according to the method of the present invention, top image photoresist layer 22 (top image layer) is photomasked and developed according to process step 301. The top image layer 22 is exposed to an activating light source through an overlying photomask (pattern) including, for example, wavelengths of 193 nm and 157 nm. Referring now to FIG. 1B, the exposed portions of the photoresist layer, e.g., 23 are developed away using a conventional developer leaving the unexposed portions of the photoresist layer 22 as a dry development mask.

Following the conventional developing process of top image photoresist layer 22, a dry development process step 303 is used to develop the exposed portions of the underlying bottom image photoresist layer 20 thereby forming a semiconductor feature etching pattern, for example, including opening 23. According to the present invention, the dry development process is preferably performed in a dual RF power source plasma reactor, for example, a high density plasma reactor such as an inductively coupled plasma (ICP) reactor or transformer coupled plasma (TCP) reactor.

Figure 2:
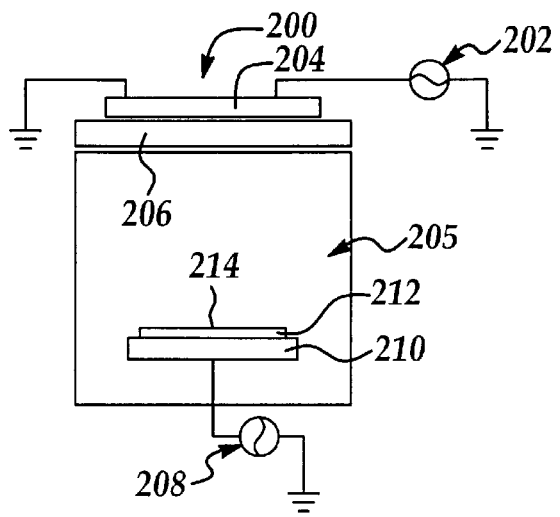
FIG. 2 is a schematic representation of portions of a plasma reactor used according to the present invention.

Turning to FIG. 2, portions of an exemplary dual RF plasma reactor 200 are shown including a first RF power source 202 for plasma excitation in plasma chamber 205 by induction coil 204 through dielectric window 206. A second RF power source 208 attached to wafer chuck 210 holding semiconductor wafer 212 operates as a bias for accelerating ions to bombard the substrate surface 214.

Figure 1C:
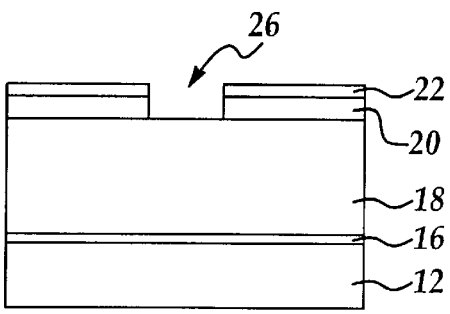

According to the present invention dry development process step 303 is next carried out with a dry development chemistry including hydrogen ($H_2$), carbon monoxide (CO), and optionally argon (Ar) as a carrier gas to dry develop exposed portions of the bottom image photoresist layer 20 to form, for example, an opening 26 extending to ILD layer 16 thereby forming an etching mask for etching a semiconductor feature, for example, a via opening as shown in FIG. 1C. Preferably, the relative concentrations of the ambient gases supplied to produce a plasma for dry development in plasma reactor 200 include about 1 part hydrogen, about 10 to about 100 parts carbon monoxide, and a remaining balance, if any, including Argon. More preferably, the ambient includes about 1 part hydrogen, about 10 to about 50 parts carbon monoxide, and about 10 to about 50 parts Argon. Suitable plasma reactor conditions include, for example, a pressure of from about 5 and about 20 mTorr, and an RF power of about 400 to about 500 Watts for the first RF power source and about 100 to about 200 Watts for the second RF power source. The etching chemistry according to the present invention provides good selectivity to the top image layer 22 in dry developing the bottom image layer 20 thereby preserving critical dimension anisotropicity. The selectivity is further optimized by preferably using a dual RF plasma reactor.

Figure 1D:
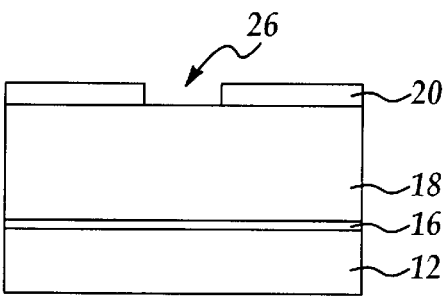

Following the dry development process of bottom image photoresist layer 20 to form an etching mask, the top image photoresist layer 22 may be optionally removed according to process step 305 by a first in-situ ashing process using an oxygen-containing plasma as shown in FIG. 1D. Optionally, the plasma may contain fluorine and/or nitrogen ions to aid in simultaneously cleaning the plasma reactor chamber surfaces (plasma contact surfaces) of residual particle contamination. For example, exemplary suitable conditions for the first in-situ ashing step of the present invention include plasma reactor operating conditions including hydrofluorocarbon and $O_2$ gas feed rates of, for example, $CF_4$ at 20 to 50 sccm and $O_2$ at 10 to 20 sccm with a total pressure of about 5 to about 20 mTorr while maintaining the first RF power source at about 200 to about 300 Watts and the second RF power source at about 100 to 150 Watts. The plasma reactor chamber ambient may optionally include a source of nitrogen in place of, or in addition to, fluorine, for example, flowing at about 10 to about 30 sccm to aid in simultaneously cleaning the plasma reactor chamber surfaces (plasma contact surfaces) during the in-situ ashing process.

Figure 1E:
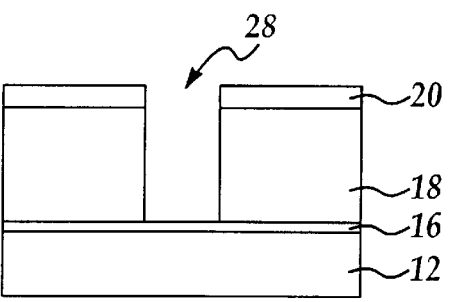

Following the optional in-situ ashing step 305 to remove top image photoresist layer 22, a fluorine based chemistry is used in a reactive ion etch (RIE) step 307 to contact etch through the ILD layer 18 to etching stop layer 16. As shown in FIG. 1E, a semiconductor feature, for example, via opening 28 is formed through the thickness of the ILD layer 18 extending to the etching stop layer 16. Suitable plasma etching gas sources include for example, conventional hydrofluorocarbons under known plasma operating conditions such as $CF_4$, but preferably include hydrofluorocarbons for example, fluorine-containing gases such as $C_2F_6$, $CH_2F_2$, and $C_4F_8$ or mixtures thereof to improve etching anisotropicity.

Figure 1F:
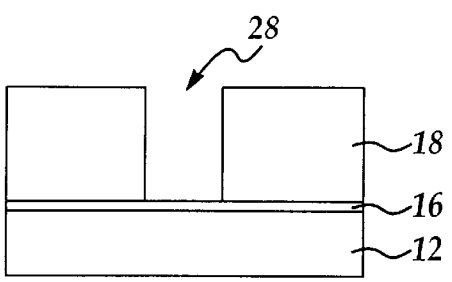

Following RIE etching step 307 to form semiconductor feature, for example via opening 28, the bottom image photoresist layer 20 (bottom image layer) is removed according to a second in-situ ashing process step 309 using an oxygen containing plasma as shown in FIG. 1F. During the first or second ashing processes, nitrogen and/or fluorine-containing gases may optionally be added to the plasma to optimize the ashing process for simultaneous cleaning the plasma reactor chamber surfaces (plasma contact surfaces) of residual particles. Exemplary suitable ashing conditions are the same as those detailed for the optional first ashing process for top image layer 22. Although the method according to the present invention may optionally include two in-situ ashing processes, the in-situ ashing processes may be combined into a single in-situ ashing process step following process step 307 (contact etch to stop layer) including etching of the semiconductor feature to the etching stop layer. For example, process step 305 may be optionally combined with process step 309 to remove top image photoresist layer 22 and bottom image photoresist layer 20 following the RIE etching of a semiconductor feature, for example etching through ILD layer 18 to form a via opening 28.

Figure 1G:
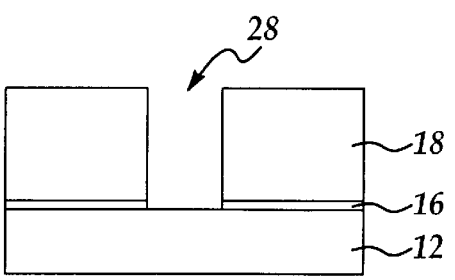

After removing bottom image photoresist layer 20, a contact hole is etched through via opening 28 thereby extending the via opening 28 through the metal nitride etching stop layer 16 to substrate 12 by a conventional RIE etching process for etching metal nitrides according to process flow step 311 (stop layer etch) and as shown in FIG. 1G. In the RIE process to etch a contact hole through the etching stop layer 16, a conventional etching process may be used, for example, including a mixture of hydrofluorocarbons, for example, a plasma gas source including a mixture of $C_2F_6$, $CH_2F_2$, and $C_4F_8$.

Following RIE etching of the etching stop layer 16, according to one embodiment of the present invention the plasma reactor chamber is subjected to an in-situ plasma cleaning process according to process step 313 to clean the plasma reactor chamber surfaces (plasma contact surfaces) to substantially the initial starting condition. The in-situ plasma cleaning process preferably includes plasma reactor etching conditions as previously outlined for the first and second ashing process to include a nitrogen and/or fluorine containing plasma.

Thus, according to the present invention, a method has been presented that allows for a more reliable bi-layer photoresist dry development chemistry with improved resolution that avoids the shortcomings of corrosion and particle contamination problems associated with the prior art dry development methods. In addition, according to the present invention, the dry development process, including the etching process is carried out with greater efficiency by allowing the semiconductor feature development process to be performed in the same plasma reactor chamber according to a continuous process from the dry development step of the bottom image layer to the in-situ cleaning process. According to the present invention, the dry development process is optimized by a dual RF plasma reactor that is additionally optimized for feature etching and in-situ cleaning by using appropriate plasma etching chemistries and reactor conditions thereby increasing the efficiency of the semiconductor manufacturing process.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for semiconductor device feature development using a bi-layer photoresist to improve an etching resolution and reduce particulate contamination comprising the steps of:

providing a non-silicon containing organic resinous layer over a substrate to from a first resist layer;

providing a silicon containing photoresist layer over the first resist layer to form a second resist layer;

exposing an exposure surface of the second resist layer to an activating light source and wet developing the second resist layer to form a second resist layer pattern revealing first resist layer portions; and, dry developing said first resist layer portions according to the second resist layer pattern to reveal the substrate in a plasma process comprising supplying hydrogen ($H_2$) and carbon monoxide (CO) to form a dry development plasma.

2. The method of claim 1, wherein the the first resist layer comprises a non-photoactive polymer.

3. The method of claim 1, wherein the activating light source comprises a wavelength selected from the group consisting of about 157 nanometers and about 193 nanometers.

4. The method of claim 1, wherein the first resist layer has a thickness greater than the second resist layer.

5. The method of claim 4, wherein the first resist layer has a thickness of about 1000 Angstroms to about 5000 Angstroms and the second resist layer has a thickness of about 500 Angstroms to about 3000 Angstroms.

6. The method of claim 1, further comprising the step of removing the second resist layer according to a first in-situ ashing process following the step of dry developing.

7. The method of claim 6, wherein the first in-situ ashing process comprises an oxygen containing plasma said oxygen containing plasma further comprising at least one of nitrogen and fluorine ions said oxygen containing plasma to simultaneously clean plasma contact surfaces.

8. The method of claim 6, further comprising the step of etching a semiconductor feature through at least a portion of the substrate according to a reactive ion etch process.

9. The method of claim 8, wherein the semiconductor feature is selected from the group consisting of a via hole, a trench line, a contact hole, a shallow trench isolation feature, and a polysilicon gate feature.

10. The method of claim 8, further comprising the step of removing the first resist layer according to a second in-situ ashing process following the step of etching.

11. The method of claim 10, wherein the second in-situ ashing process further comprises an oxygen containing plasma further comprising at least one of nitrogen and fluorine, the oxygen containing plasma to simultaneously clean plasma contact surfaces.

12. The method of claim 10, wherein the steps of dry developing, the first in-situ ashing process, the reactive ion etch process, and the second in-situ-ashing process, are carried out according to a continuous process.

13. The method of claim 1, wherein the dry development plasma is formed of gases consisting essentially of hydrogen and carbon monoxide.

14. The method of claim 13 wherein the dry development plasma is formed of gases consisting essentially of hydrogen, carbon monoxide, and argon.

15. The method of claim 1, wherein the first resist layer is selected from the group consisting of an I-line photoresist, an acrylic polymer, and a polyvinyl alcohol polymer.

16. The method of claim 1, wherein the second resist layer comprises a DUV photoresist wherein the silicon comprises silicon incorporated from one of a silylation process and from silicon monomers included in the photoresist.

17. A method for etching a semiconductor device feature using a bi-layer photoresist to improve an etching resolution and reduce particulate contamination comprising the steps of:

providing a non-silicon containing organic resinous layer over a dielectric insulating layer to from a first resist layer;

providing a silicon containing photoresist layer over the first resist layer to form a second resist layer;

patterning the second resist layer according to a photolithographic exposure process comprising a wavelength of about 157 nm or about 193 nm;

wet developing the second resist layer to form a patterned second resist layer;

dry etching according to a dry etching chemistry formed by supplying gases consisting essentially of hydrogen ($H_2$), carbon monoxide, and optionally, argon, the first resist layer portions to reveal the dielectric insulating layer to form an etching mask; and, etching an opening in the dielectric insulating layer.

18. The method of claim 17, wherein the second resist layer is removed in-situ according to an oxygen ashing process prior to the step of etching.

19. The method of claim 18, wherein one of fluorine and nitrogen is added during the oxygen ashing process to simultaneously clean plasma contact surfaces including a plasma reactor chamber contact surface.

20. The method of claim 17, wherein at least the first and second resist layers are removed in-situ according to an oxygen ashing process following the step of etching.

21. The method of claim 20, wherein one of fluorine and nitrogen is added during the oxygen ashing process to simultaneously clean plasma reactor chamber surfaces.

22. The method of claim 17, wherein the first resist layer is selected from the group consisting of an I-line photoresist, an acrylic polymer, and a polyvinyl alcohol polymer.

23. The method of claim 17, wherein the second resist layer comprises a DUV photoresist wherein the silicon comprises silicon incorporated from one of a silylation process and from silicon monomers contained within the photoresist.

* * * * *